（12）United States Patent
Liaghati (10) Patent No.: US 9,774,343 B1
(45) Date of Patent: Sep. 26, 2017

(54) METHOD AND APPARATUS FOR IMPROVING THE RESOLUTION OF DIGITALLY SAMPLED ANALOG DATA

(71) Applicant: The Boeing Company, Chicago, IL (US)

(72) Inventor: Amir L. Liaghati, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/209,022

(22) Filed: Jul. 13, 2016

(51) Int. Cl.
*H03M 1/18* (2006.01)
*H03M 1/34* (2006.01)

(52) U.S. Cl.
CPC ............ *H03M 1/34* (2013.01); *H03M 1/181* (2013.01)

(58) Field of Classification Search
USPC ................................................. 341/110, 139
See application file for complete search history.

(56) References Cited

U.S. PATENT DOCUMENTS

| | | | | |
|---|---|---|---|---|
| 4,827,191 A * | 5/1989 | Chapman | ................ | H03M 1/16 341/132 |
| 5,034,745 A * | 7/1991 | Kelly | .................... | H03M 1/182 341/155 |
| 5,345,235 A * | 9/1994 | Babcock | ............... | H03M 1/182 341/139 |
| 6,275,259 B1 * | 8/2001 | Gowda | ................. | H04N 5/243 341/138 |
| 7,583,211 B1 * | 9/2009 | Wu | ...................... | H03M 1/182 341/120 |
| 8,378,872 B2 * | 2/2013 | Rud | ....................... | H03M 1/20 341/131 |
| 8,860,593 B2 * | 10/2014 | Kimura | ................. | H03M 1/182 341/118 |
| 9,160,359 B2 * | 10/2015 | Shiraishi | ............ | H03M 1/1245 |
| 9,276,599 B2 | 3/2016 | Liaghati | | |

OTHER PUBLICATIONS

"TechTip: Accuracy, Precision, Resolution, and Sensitivity", MC Measurement Computing, last accessed Apr. 13, 2016,. (http://www.mccdaq.com/techtips/techtip-1.aspx).
"Chapter 12 Instrumentation: Sensors to A/D Converters"(Literature No. SLOA084), Excerpted from Op Amps for Everyone (Literature No. SLOD006A), Texas Instruments, last accessed Apr. 27, 2016. (http://www.ti.com/lit/ml/sloa084/sloa084.pdf).
"Getting the Max Resolution from Your Analog Measurements", Sealevel, Apr. 27, 2015, Ref. No. AA-00622. (http://www.sealevel.com/support/article/AA-00622/0/Getting-the-Max-Resolution-from-Your-Analog-Measurements.html).
"AVR121: Enhancing ADC resolution by oversampling", Atmel, pp. 1-14, Rev. 8003A-AVR-09/05, Sep. 2005. (http://www.atmel.com/images/doc8003.pdf).
"Improving ADC Resolution by Oversampling and Averaging", Silicon Labs, Rev. 1.3, pp. 1-22, Jul. 2013. (https://www.silabs.com/Support%20Documents/TechnicalDocs/an118.pdf).

* cited by examiner

*Primary Examiner* — Howard Williams
(74) *Attorney, Agent, or Firm* — Gates & Cooper LLP (57) ABSTRACT

A system and method is described for converting an analog signal into a digital signal. The gain and offset of an ADC is dynamically adjusted so that the N-bits of input data are assigned to a narrower channel instead of the entire input range of the ADC. This provides greater resolution in the range of interest without generating longer digital data strings.

17 Claims, 8 Drawing Sheets

METHOD AND APPARATUS FOR IMPROVING THE RESOLUTION OF DIGITALLY SAMPLED ANALOG DATA

STATEMENT OF RIGHTS OWNED

This invention was made with Government support under NNM07AB03C awarded by the National Aeronautics and Space Administration (NASA). The Government has certain rights in this invention.

BACKGROUND

1. Field

The present disclosure relates generally to systems and methods for converting analog signals into digital signals and in particular to a system and method for adaptively adjusting resolution of a digital channel.

2. Description of the Related Art

Analog-to-digital converters (ADCs) are devices that convert a continuous physical signal (typically voltage) to a digital number that represents the signal's amplitude. This is typically accomplished by sampling the input signal, and converting that sampled signal into a digital output.

The analog signal may be a continuous signal of voltage or current that represents a physical parameter such as temperature or pressure. Such analog signals may be provided by appropriate sensors.

Quantization is the process of converting a continuous range of values into a finite range of discrete values. In this manner, quantizing an analog signal means creating a series of discrete digital values that represent the analog signal. These discrete digital values may be represented in, for example, binary format.

The resolution of an analog-to-digital converter is determined by the number of discrete values that can be produced over a range of analog values. In some cases, the resolution of an analog-to-digital converter may be expressed in bits and referred to as bit resolution. An analog-to-digital converter with an N-bit resolution may be able to produce 2N discrete values. In other cases, the resolution of the analog-to-digital converter may be defined based on the type of measurements received as input. For example, the resolution of an analog-to-digital converter that receives an analog voltage signal as input may be the overall voltage measurement range for the analog-to-digital converter divided by the number of discrete values possible. In particular, the voltage resolution of an analog-to-digital converter may be determined by the least significant bit (LSB) voltage, which is the minimum change in voltage needed to cause a change in the digital output. As the least significant bit voltage decreases, the resolution increases. Other ADC performance related parameters include the sampling rate, accuracy, jitter, and signal to noise ratio.

Problems arise when ADCs are used to sample signals spanning large measurement ranges. For example, the voltage of a temperature sensor's output signal may vary between zero volts and five volts to represent a relatively large range of temperatures (e.g., −300 to 200 degrees Celsius). When converting the analog signal from the sensor to a digital signal using an ADC, values of the analog signal are periodically sampled. Each of these values is assigned a digital (e.g. binary) number, such as an 8-bit, 10-bit, or 12-bit binary number. In an example of an 8-bit ADC, zero volts may be assigned the digital number 00000000 and five volts is assigned digital number 11111111. In this 8-bit scheme, there are 256 possible binary numbers that can be assigned to sampled analog values.

When the voltage ranges represents a range of 500 degrees Celsius, and there are only 256 possible binary values, the sensor resolution (as determined by the digital numbers from the ADC) is approximately 1.95 degrees. If such a sensor and ADC were used to monitor and/or control the temperature of a cryogenic tank, the steps between binary values may be too large to detect a change of 1 degree Celsius from a cryogenic temperature to a non-cryogenic temperature.

One way to achieve higher sensor resolution is to use an ADC with a greater bit capacity to produce bits in the binary numbers. For example, a 10 bit or 12 bit ADC would provide many more steps along the range of possible analog values. However, such ADC converters are more expensive, and create more data to transmit and/or store. Another way to detect the one degree Celsius change of the foregoing example would be to weight the assignment of binary numbers so the steps/intervals are closer together in a range of interest (e.g., non-linear distribution of intervals) as in U.S. Pat. No. 9,276,599, entitled "Method and apparatus for non-uniform analog-to-digital conversion," which is hereby incorporated by reference herein.

What is needed is a system and method for providing the advantages of higher resolution sampling without the cost or data overhead. The methods and systems described herein satisfy that need.

SUMMARY

To address the requirements described above, this document discloses a system and method for converting an analog signal into a digital signal. In one embodiment, the method comprises (a) digitizing the analog signal into a plurality of N-bit digital signal values, wherein the plurality of N-bit digital signal values span from a minimum analog signal value $V_{min}$ to a maximum analog signal value $V_{max}$, (b) determining an updated minimum analog signal value $V_{min}$ and an updated maximum analog signal value $V_{max}$ from the plurality of N-bit digital signal values for a subsequent plurality of N-bit digital signal values, (c) repeating (a)-(b) for the subsequent plurality of N-bit digital signal values using the updated minimum analog signal value $V_{min}$ and the updated maximum analog signal value $V_{max}$, and (d) repeating (a)-(c) for further subsequent pluralities of the N-bit digital signal values. Another related embodiment is evidenced by an apparatus for converting an analog signal into a digital signal, comprising an analog to digital converter; and a processor, communicatively coupled to a memory comprising processor instructions, the processor instructions comprising instructions for performing the foregoing operations. A further embodiment is evidenced by a system for monitoring a physical property, that comprises a sensor configured to output an analog signal representing the physical property, an analog to digital converter, and a monitoring system, comprising a processor, communicatively coupled to a memory comprising processor instructions, the processor instructions comprising instructions for performing the foregoing operations.

The features, functions, and advantages that have been discussed can be achieved independently in various embodiments of the present invention or may be combined in yet other embodiments, further details of which can be seen with reference to the following description and drawings. In particular, use of this technique provides higher resolution measurements from standard resolution ADCs and/or using equivalent resolution measurements from lower resolution ADCs, and does not require the transmission of data overhead in the form of indicators or code words to inform the decoder of changes in resolution. Instead, resolution changes are made based on channel measurements that both the encoder and decoder can make using the same M previous samples and using the same logic or algorithm. This results in data overhead savings.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Overview

The ADC described herein dynamically adjusts the gain and offset of the ADC or its input circuitry so that the N-bits of input data are assigned to a narrower channel instead of the entire input range of the ADC. This provides greater resolution in the range of interest without generating longer digital data strings. This channel for higher resolution of sensor data without increasing the bit level of the ADC is described in further detail below. In an exemplary embodiment, the channel output is set to a narrower voltage limit to capture the first M samples. For example, the entire voltage output of a channel during an entire flight mission might be from 0 to 5 volts, however, the maximum voltage for the first 1000 samples may be only 1.2 volts, and it may be known that the output function is a monotonically increasing function. Since the signal may be noisy, channel range is set with some threshold that the initial output voltage will always capture the worst case voltages, for example 0 volts to 2 volts. Once the initial value is selected, the sensor signal is provided to the ADC, where it is converted to an N-bit binary format. This process continues until it reaches first M samples. An encoder looks at the maximum voltage value, and calculates a threshold value(s) that can be added to the $V_{min}$ and $V_{max}$ (the threshold value may be the same or different for $V_{min}$ and $V_{max}$). For instance, if the maximum voltage measured on the channel during the previous 1000 samples is 1.2 volts, the new channel may set its $V_{min}$ to 0 volts and $V_{max}$ to 3 volts. This process continues for the entire mission.

This technique is particularly useful for measuring signals representing physical parameters (such as temperature or pressure) that change gradually or remain substantially constant over time. It is also particularly useful for measuring signals representing physical parameters that monotonically increase over time. For example, in one embodiment, the ADC is used in a system than controls/monitors a cryogenic storage tank in which temperatures are expected to remain in the cryogenic range or increase gradually. In such an application, the entire range of analog values may be 0V to 5V, but the cryogenic range of interest is between approximately zero and 2.5 volts. Use of the technique makes better use of the N-bits of data available from the ADC (to provide better resolution) and avoids transmitting extraneous bits (as would be required for analog values over three volts.

For example, there are instances where voltage of the channel is known to increase as a function of time. Such channels may include channels measuring engine inlet temperature or fill/drain line temperature. If the channel is an N bit value, there will be $2^N$ counts. For example, for an 8-bit channel there are 256 counts, 0 represents the lowest voltage in the channel and 255 represents the highest voltage in the channel. The resolution is the voltage step that each count represents, which can be expressed as $(V_{max}-V_{min})/(2^N-1)$, and is typically temporally constant. If we want to increase the resolution, we need to pick higher N, for instance a 12-bit ADC.

In an exemplary embodiment, predetermined number (M) of samples are acquired and converted by the ADC. Those M samples are used to compute an updated range for the ADC. For example, in one embodiment, if the first M samples are all in the range of zero to 1.2 volts, the ADC chooses an updated range of zero to two volts to ensure that the maximum value (worst case) of 1.2V is included in the range, for example, in the middle of the range. The updated range or the technique used to compute the updated range may depend on the number of samples taken (M) before the update takes place. For example, if the range is updated after every 1000 samples, a different choice of the updated range may be made.

The ADC then assigns the minimum digital value to the bottom of the range (0V) and the maximum digital value to the top of the range (2V), which gives a higher resolution interval as compared to distributing the intervals from zero to five volts. The ADC acquires another M samples to again determine the maximum value to adjust the narrow channel to, for example, one to three volts and adjusts the binary assignments to this narrower range channel. A decoder that receives the binary stream generated by the ADC includes analogous complementary instructions to acquire M samples and account for the adjustments made to the ADC to rescale the digital values. Since both the ADC and the decoder use the same output values from the ADC and the same algorithm to compute the updated range, no information need pass from the ADC to the decoder, and hence, no overhead bits are included in the binary stream.

Figure 1:
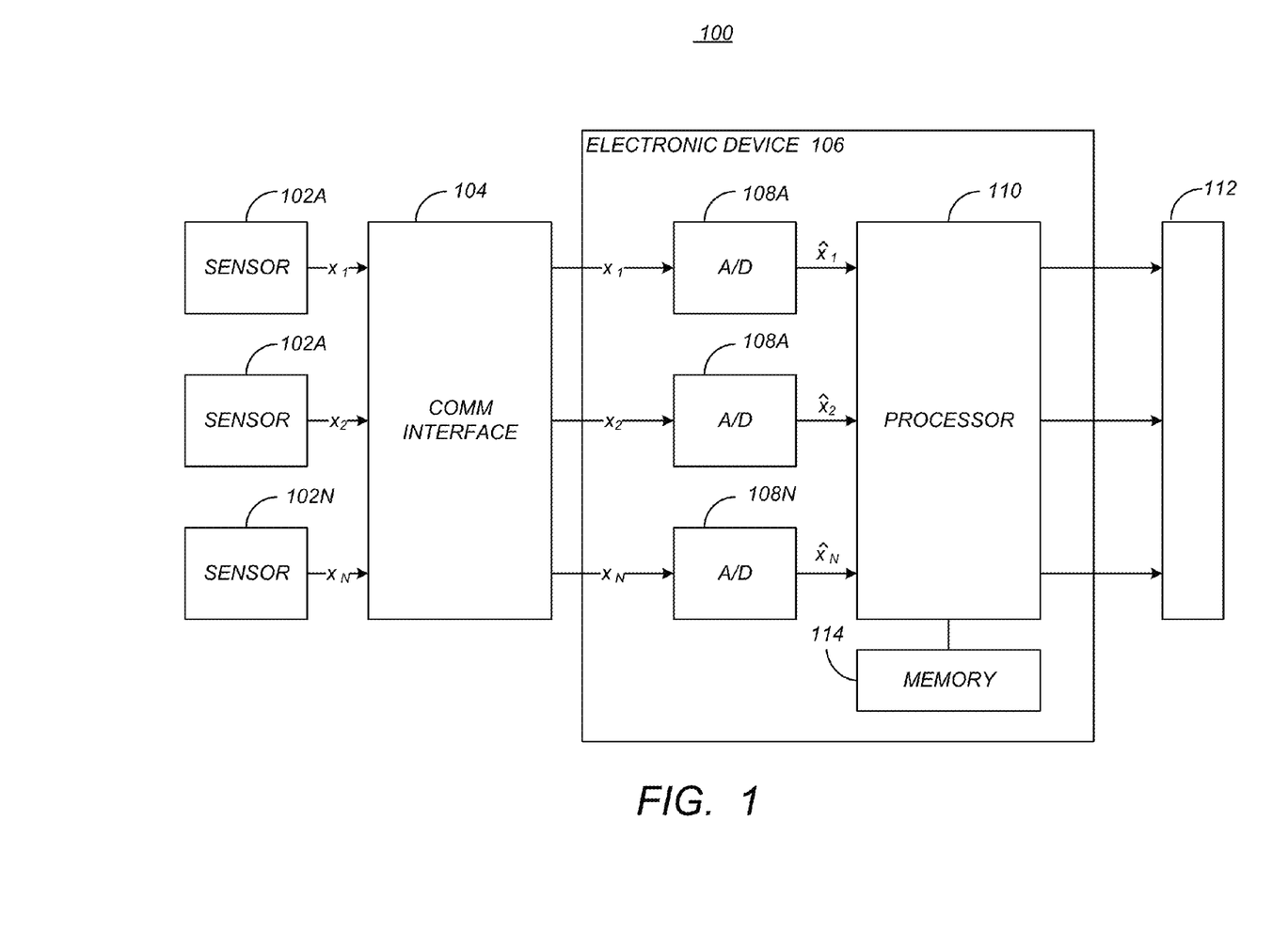
FIG. 1 is a diagram illustrating a one embodiment of an exemplary data encoding system.

FIG. 1 is a diagram illustrating one embodiment of an exemplary data encoding system 100. The data encoding system 100 may include one or more sensors 102A-102N (hereinafter alternatively referred to as sensor(s) 102) in communication with an electronic device 106. The sensors 102 may be any type of transducer for monitoring a characteristic of a system and generating electric signals indicative of the characteristic being monitored. In one embodiment, the sensors 102 may be part of a space launch system, however this disclosure is not limited to such a system. For example, in another embodiment, the sensors 102 may be associated with another system such as, for example, a refinery, a manufacturing facility, an aircraft, or a satellite.

The sensors 102 may be used to monitor various characteristics of a system such as, for example, temperature or pressure. The sensors 102 may have a minimum sampling rate of twice the frequency of the monitored signal. The electronic device 106 may be used to communicate data from the sensors 102 to one or more external devices 112, such as a network. In the exemplary embodiment as shown in FIG. 1, the electronic device 106 may communicate with the external devices 112 over wired or wireless connection. For example, the external devices 112 may be a terrestrial system for communicating with the sensors 102 of a space launch system.

The electronic device 106 may include or be communicatively coupled to the sensors via a communication interface 104. In the illustrated embodiment, the electronic device 106 comprises a processor 110, which includes or is communicatively coupled to a memory 114 storing processing instructions. When the electronic device 106 is in operation, the processor 110 executes instructions stored within the memory 114, to communicate data to and from the memory 114, and to generally control operations of the electronic device 106 pursuant to the instructions. A processor may be any custom made or commercially available processor, a central processing unit (CPU), or generally any device for executing instructions. Although illustrated as a part of the electronic device 106, the processor 110 and associated memory 114 may be implemented in one or more of the external devices 112.

The electronic device 106 receives electric signals $x_1$-$x_N$ from the sensors 102 by way of the communication interface 104 at a specific sampling rate. The electric signals $x_1$-$x_N$ are analog signals such as, for example, voltage values, and the change or differential in the electric signals $x_1$-$x_N$ generated by the sensors 102 may occur relatively gradually, as changes in characteristics such as temperature or pressure do not typically occur instantaneously.

The electric signals $x_1$-$x_N$ are provided to an associated one of a plurality of N-bit ADCs 108A-108N (alternatively referred to hereinafter as ADC(s) 108). The ADCs 108 sample the electric signals $x_1$-$x_N$ and produce digital signals $\hat{x}_1$-$\hat{x}_N$. These digital signals comprise digital words of N-bits. In one embodiment, the default number of bits may be eight. However, as explained in greater detail below, the ADCs 108 may encode the electric signals from the sensors 102 into a fewer number of bits than the default value (e.g., a 4-bit value), or, alternatively the ADCs 108 may encode the electric signals from the sensors 102 into a greater number of bits than the default value (e.g., a 10-bit value). It is to be understood that while 4-bit, 8-bit, and 10-bit values are described in the present application, the disclosure is not limited to these examples. In one embodiment, the digital signals $\hat{x}_1$-$\hat{x}_N$ are then stored within the memory 114 of the electronic device 106, but as described above, may be instead stored in one or more of the external devices 112. Using processor instructions stored in the memory 114, the processor processes the digital signals $\hat{x}_1$-$\hat{x}_N$ to produce the output data.

Figure 2A:
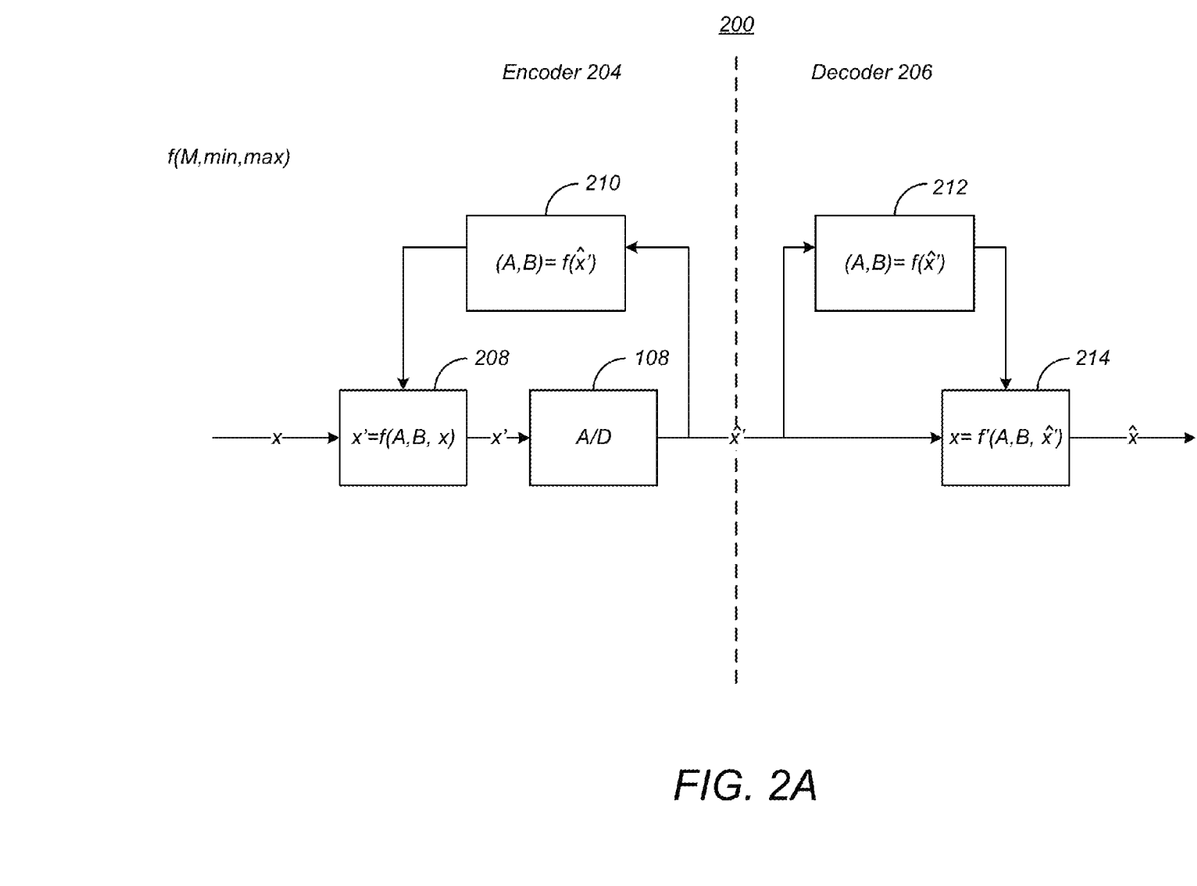
FIGS. 2A and 2B are diagrams of embodiments of an improved apparatus for converting an analog signal into a digital signal.

FIG. 2A is a diagram of one embodiment of an improved apparatus 200 for converting an analog signal into a digital signal. In the illustrated embodiment, input signal x (representing any of ($x_1$, $x_2$ . . . $x_N$) is provided to an input processor 208. Input processor 208 maps the input signal value x, to generate a modified input signal x'. In the illustrated embodiment, the mapping is a function of two ADC parameters (A and B) and the input such that x'=f(A, B, x), but other functions with a greater or fewer number of parameters can also be implemented as further described below.

The mapped input signal value x' is provided to the ADC 108 of the encoder 204. The ADC then samples the mapped input signal value x', and digitizes the sampled result to obtain a mapped digital output $\hat{x}'$. The mapped digital output $\hat{x}'$ is provided to a feedback processor 210. The output processor 210 generates updated ADC parameters and provides those parameters to the input processor 208 as further described below. In the illustrated embodiment, the feedback processor 210 generates values for A and B from the mapped digital output $\hat{x}'$, hence, (A, B)=f($\hat{x}'$). This essentially creates a feedback loop in which the digital output $\hat{x}'$ is used to modify the input signal x before being sampled and quantized by the ADC 108. While the foregoing illustrates input processing performed by the input processor 208 and the feedback processing performed by the feedback processor 210 as being performed external to the ADC 108, such operations may be implemented within the ADC 108 itself as well.

The digital output $\hat{x}$ from the ADC 108 is provided to the decoder 206. The decoder 206 provides the digital output $\hat{x}$ to a feedforward processor 212 and an output processor 214. The output processor 214 further maps the mapped digital output $\hat{x}'$ of the encoder 204 to a digital output $\hat{x}$ according to parameters that are generated by the feedforward processor 212 from the mapped digital output $\hat{x}'$ of the encoder 204. In the illustrated embodiment, the further mapping is a function of two ADC parameters (A and B) and the input such that x=f(A, B, $\hat{x}'$), but other functions with a greater or fewer number of parameters can also be implemented as further described below. In one embodiment the feedforward processor 212 implements the same functionality as the feedback processor 210 and therefore generates the same values from the same mapped digital output $\hat{x}'$. As a consequence, no information regarding the mapping need be transmitted from the encoder 204 to the decoder to implement the further mapping function implemented by the post processor 214.

Figure 2B:
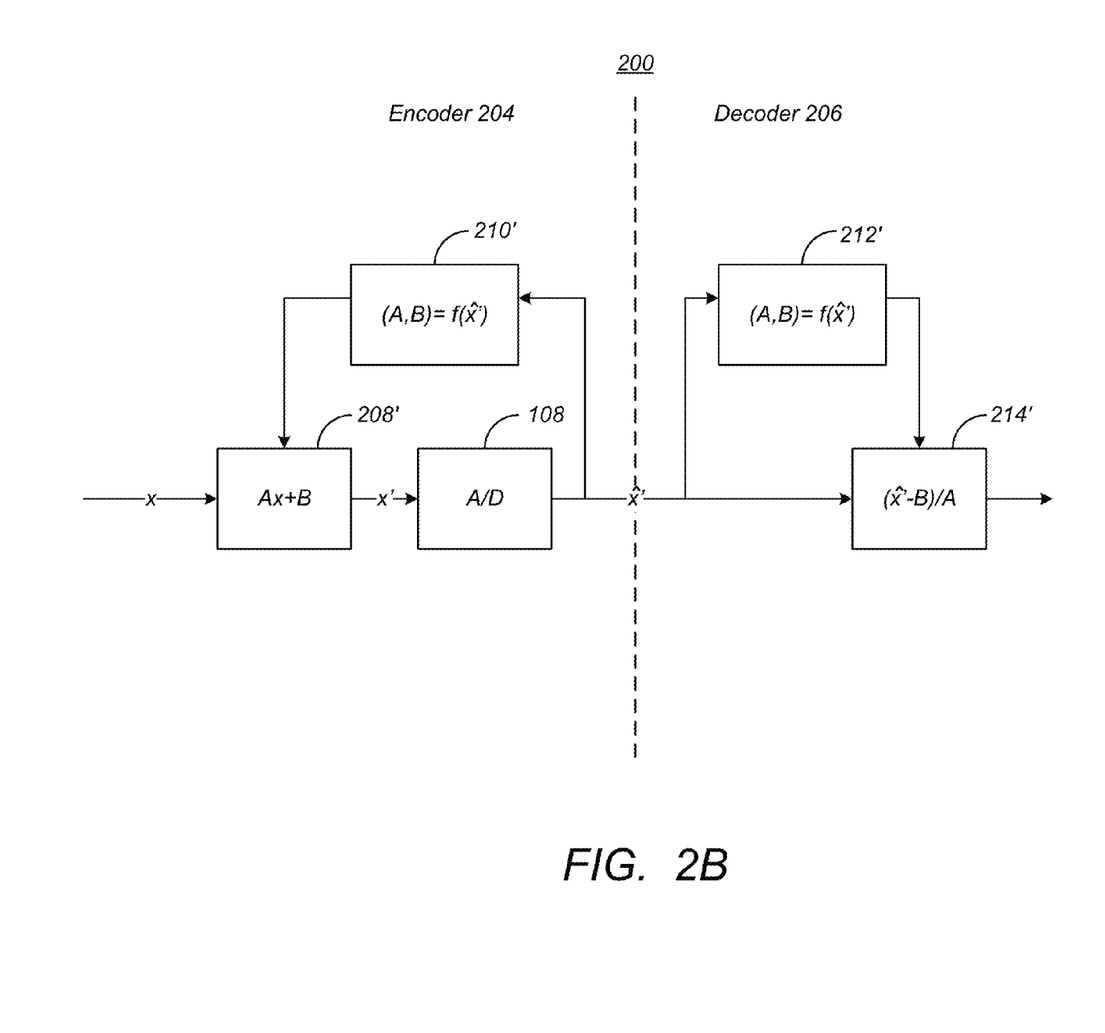

FIG. 2B is a diagram presenting another embodiment of the improved apparatus for converting an analog signal into a digital signal. In this embodiment, the feedback processor 210' generates two factors (A and B) from the mapped digital output $\hat{x}'$. Those two parameters are provided to the pre-processor 208', which implements a scaling and biasing function that is applied to the analog input signal x, with the factor B biases the analog input signal up or down in value, and the factor A scaling the analog input as well. Also in this embodiment, the post processor 214' accepts the mapped digital output $\hat{x}'$ and applies an mapping function that is the inverse or complement of the mapping function applied by the pre-processor 208'. In this case, that inverse function is ($\hat{x}'$ −B/A, which first removes the bias applied by the pre-processor 208' then re-scales the result by A.

As described further below, the foregoing may be implemented by the feedback processor 210' recomputing the scale factor and bias for a fixed, predetermined number of samples M. Since both the pre-processor 208', feedback processor 210' and post processor 214' and the feed forward processor 212', apply complementary functionality after the same number of samples M have been produced by the ADC 108, there is no need for the encoder 204 to communicate any information other than the data itself to the decoder 206.

In an exemplary implementation, the feedback processor 210' examines digital output $\hat{x}$', and determines the maximum value for the first M samples. That maximum value is used to compute a minimum expected value for the analog input signal x over the next subsequent M samples (hereinafter referred to as $V_{min}$) and a maximum expected value for the analog input signal x over the next subsequent M samples (hereinafter referred to as $V_{max}$). The bias value can then be computed as $B=V_{min}$, and the scale factor computed as $$A = \frac{1}{V_{max} - V_{min}}.$$

Analogous values may be computed by the feed forward processor 212'.

In other implementations, other parameters can be derived from the digital output $\hat{x}$', and used to generate processing parameters that are provided to the pre-processor 208' (for example, $V_{max}$ and $V_{min}$). For example, the processing parameters provided to the pre-processor 208' may be generated based on both the minimum and maximum values of the digital output $\hat{x}$', and/or based on the mean and standard deviation of the digital output $\hat{x}$'. In any case, so long as the feed-forward processor 212' is configured to compute the same processing parameters provided to the post-processor 214' from the same digital output $\hat{x}$', no information need be transmitted from the encoder 204 to the decoder 206 to assure that the digital output $\hat{x}$' is properly biased and scaled.

Figure 3:
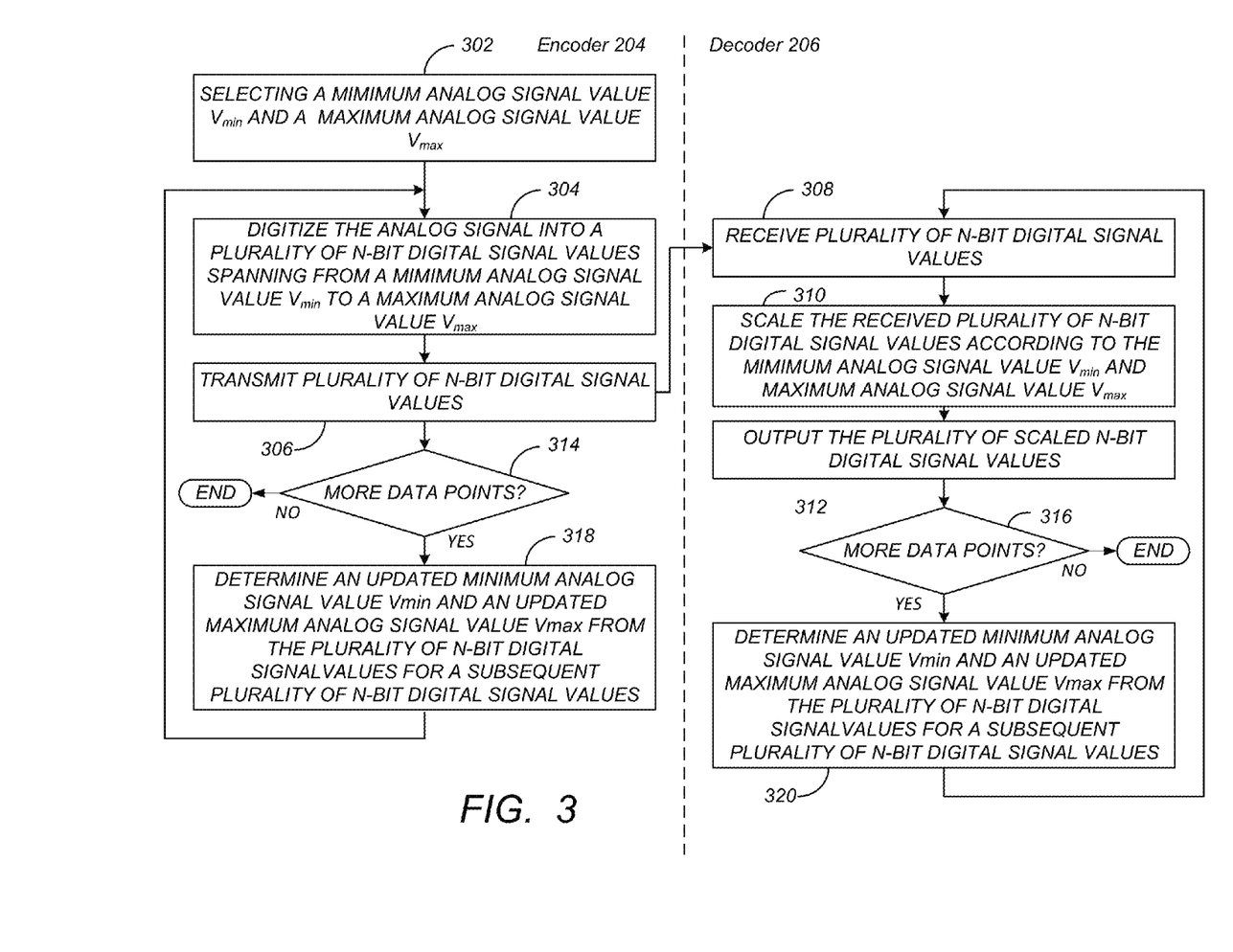
FIG. 3 is a diagram presenting a flow chart of exemplary processes that can be performed to convert an analog signal into a digital signal.

FIG. 3 is a diagram presenting a flow chart of exemplary processes that can be performed to convert an analog signal into a digital signal. The process begins in bock 302 with the selection of a minimum analog signal value ($V_{min}$) and a maximum analog signal value ($V_{max}$). For example, in an embodiment in which the temperature of a component is being measured by the sensor 102, it may be known that the temperature is expected to vary between 20 degrees Celsius and 40 degrees Celsius, corresponding to analog signal values of 0.1 and 1.8 volts, respectively. In this case, $V_{min}$ may be selected as 0.1 volts and $V_{max}$ may be selected as 1.8 volts, but it is preferred practice to allow for some errors in the preliminary estimate of the expected values of the analog signal, and to select $V_{min}$ as 0 volts and $V_{max}$ as 2.0 volts.

Next, the analog signal is digitized into a plurality of N-bit digital signal values spanning from the minimum analog signal value $V_{min}$ to the maximum analog signal value $V_{max}$, as shown in block 304. In one embodiment, the plurality comprises a predetermined number of N-bit digital signal values that remains constant (for example, M digital signal values). This can be accomplished, for example, by the preprocessor 208 and the ADC 108.

Figure 4:
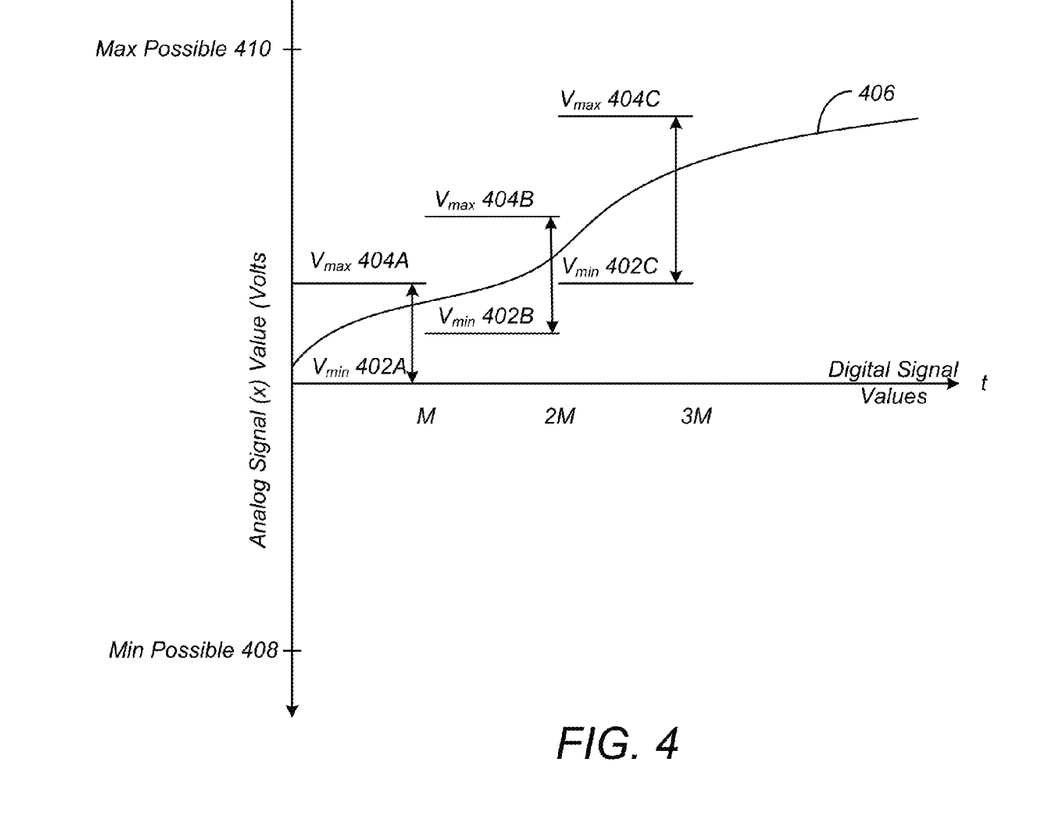
FIG. 4 is a diagram presenting an illustrative example of the application of the processes described in FIG. 3.

FIG. 4 is a diagram presenting an illustrative example of the application of the processes described in FIG. 3. The analog signal x is presented in plot 406 as a function of time. The initial value of $V_{min}$ 402A and $V_{max}$ 404A are plotted, and based upon these values, the pre-processor 208 pre-processes the analog input signal so that the full range of the ADC 108 remains between $V_{min}$ and $V_{max}$. This permits all or almost all of available N-bits of resolution to be used in sampling the analog input signal over the M measurements.

Returning to FIG. 3, the plurality of N-bit digital signal values are transmitted to the decoder 206. In block 308, the plurality of N-bit digital signal values are received by the decoder 206. The received plurality of N-bit digital signal values are biased and scaled according to the minimum analog signal value $V_{min}$ and the maximum analog signal value $V_{max}$ selected in block 302. This can be accomplished, for example, by the post processor 214. The plurality of digital signal values are then output.

Block 314 determines if there are more N-bit digital signal values remain to be generated after the generation of the foregoing plurality of N-bit digital signal values. If not, processing terminates. If more N-bit digital signal values remain to be generated, processing is routed to block 318. Block 318 determines an updated minimum analog signal value $V_{min}$ 402B and an updated maximum analog signal value $V_{max}$ 404B from the plurality of N-bit digital signal values for a subsequent plurality of N-bit digital signal values. This may be accomplished, for example, by the feedback processor 210. Processing is then routed to block 304, where the updated minimum analog signal value $V_{min}$ 402B and the maximum analog signal value $V_{max}$ 404B are used to digitize the analog signal into a subsequent plurality of N-bit digital values. This is illustrated in FIG. 4 for the interval between the M N-bit digital signal values and the 2M N-bit digital signal values.

Similarly, the block 316 determines if there are more N-bit digital signal values remain to be decoded after decoding of the foregoing plurality of N-bit digital signal values. If not, processing terminates. However, if more N-bit digital signal values remain to be generated, processing is routed to block 320. Block 320 determines an updated minimum analog signal value $V_{min}$ and an updated maximum analog signal value $V_{max}$ from the plurality of N-bit digital signal values for a subsequent plurality of N-bit digital signal values. This may be accomplished, for example, by the feed forward processor 212. Processing is then routed to block 308 to await the reception of the subsequent plurality of N-bit digital signal values.

The foregoing process is repeated to generate each subsequent plurality of N-bit digital signal values from the analog signal.

Figure 5:
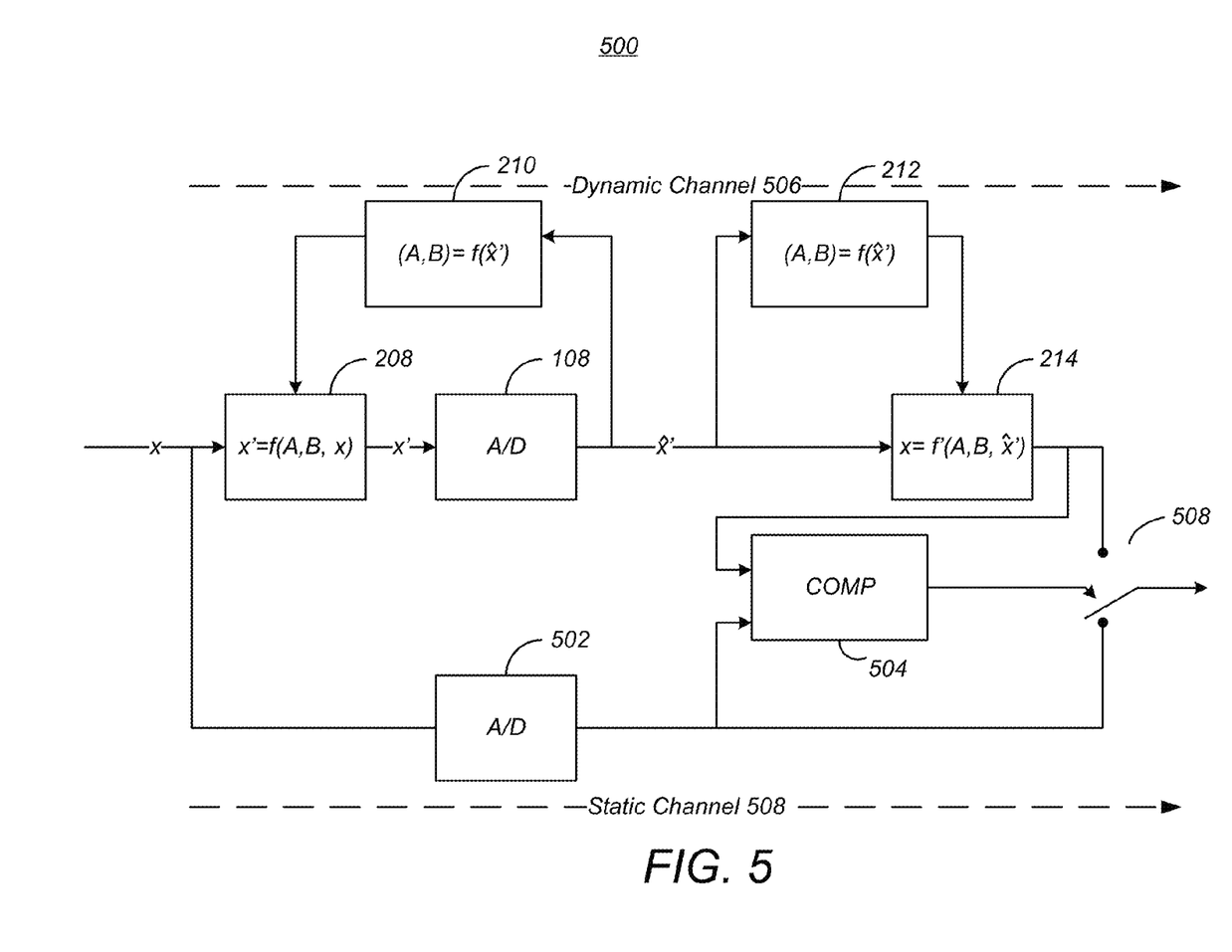
FIG. 5 is a diagram illustrating another embodiment of an apparatus for converting an analog signal into a digital signal.

FIG. 5 is a diagram illustrating another embodiment of an apparatus 500 for converting an analog signal into a digital signal. In addition to the primary ADC 108 used to create a dynamic (autonomous) channel 506 for converting sensor data, this embodiment comprises a secondary ADC 502 that is used parallel with the primary ADC 108. This secondary ADC 502 is used to create a static information channel 508 of temporally constant resolution that covers the entire 0-5V range of the ADC 502. Information from the secondary ADC 502 is used to check or backup the information provided by the primary ADC 108, to account for instances when the temperature or pressure measurement is outside of the dynamically-determined narrower channel available from the primary ADC 108. For example, in a case where the $V_{min}$ and $V_{max}$ for the primary ADC 108 of the narrow channel was selected to be 1-3V, but the analog signal itself is 4V, the primary ADC 108 will be incapable of representing the input analog signal.

A comparison unit or comparator 504 receives binary streams from the static channel 508 and the dynamic channel 506, compares the streams, and determines if the static channel 508 generates a value outside the range of the dynamic channel 506. In one embodiment, this is accomplished by, the comparison unit 504 reading the digital value from post processor 214 and from the secondary ADC 502, and comparing the two values. Since the two values should be within a threshold difference of one another (accounting for noise, ADC linearity and other factors), if the two values differ by more than a threshold amount, it is inferred that the primary ADC 108 has been asked to digitize a value less than $V_{min}$ or greater than $V_{max}$.

If the static channel 508 value is outside of the dynamic channel 506 range, the comparison unit 504 causes (for example, via switch 508) the output to be the digital signal from the secondary ADC 502 instead of the digital signal from the primary ADC 108 and the post processor 214. Although the digital signal from the secondary ADC 502 is of lower resolution than the digital signal from the primary ADC 108 and the post processor, the output more accurately represents the analog input signal x.

In one embodiment, the comparator 504 also creates an overhead string to signal that a change is being made and the digital output signal is of different resolution. The overhead string may also provide information regarding the change itself (for example, sending a code indicating one of a discrete number of resolutions has been chosen). The output of the dynamic channel 506 and/or static channel 508 (if present) can be used to control the temperature or pressure in the storage tank and/or alarm an operator if the change of temperature/pressure is more than expected.

Figure 6:
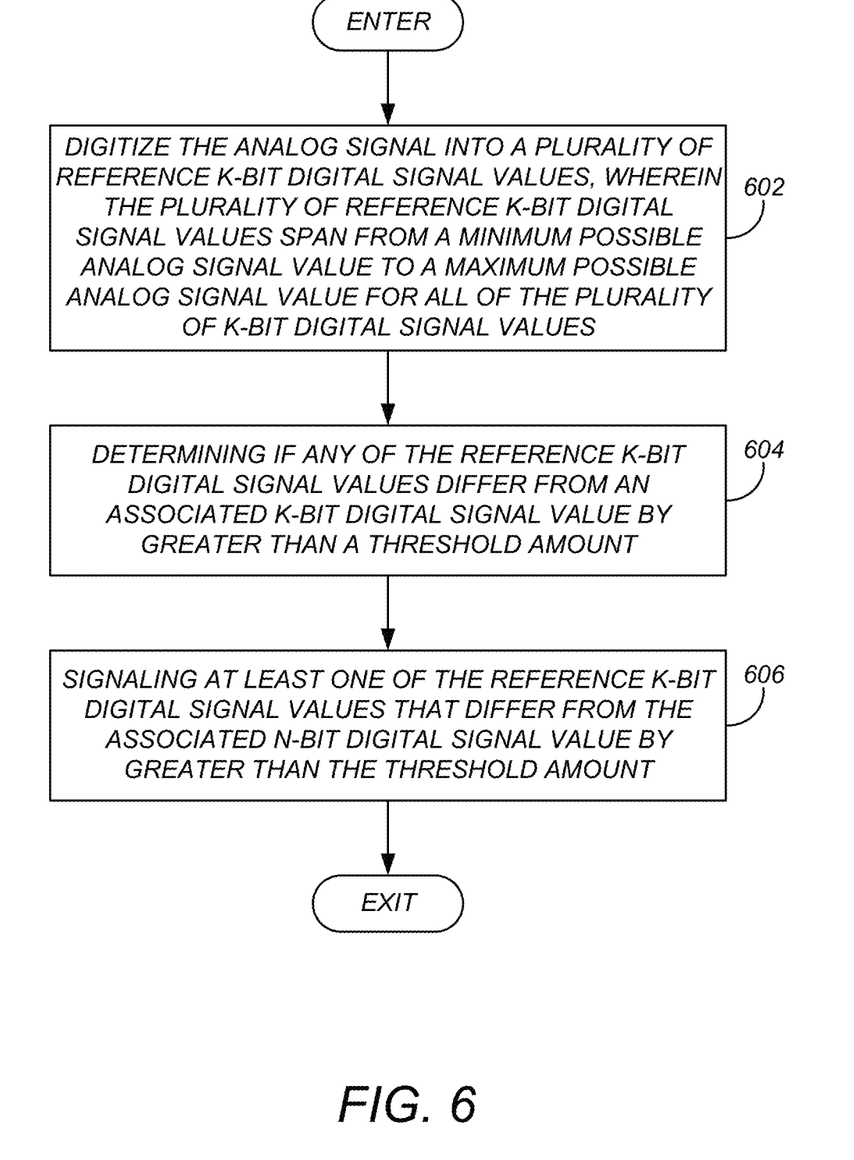
FIG. 6 is a diagram illustrating a flow chart of exemplary processes that can be performed to implement the foregoing embodiment having both a dynamic channel and a static channel.

FIG. 6 is a diagram illustrating a flow chart of exemplary processes that can be performed to implement the foregoing embodiment having both a dynamic channel 506 and a static channel 508. In block 602, the analog input signal x is digitized into a plurality of reference K-bit digital signal values, wherein the plurality of reference K-bit digital signal values span from a minimum possible analog signal value 408 to a maximum possible analog signal value 410 for all of the plurality of K-Bit digital signal values, as shown in block 602. This can be performed, for example by the secondary ADC 502, with the input scaled so that the maximum variation in the analog input signal x (e.g. zero to 5 volts) falls within the dynamic range of the secondary ADC 502. For example, if the secondary ADC 502 is an 8 bit ADC, zero volts can be set to correspond to a digital output value of 00000000, and five volts can be set to correspond to a digital output value of 11111111. Although no preprocessor is shown in FIG. 5, the analog input signal may be scaled and biased in cases where the analog input signal does not match the dynamic range of the secondary ADC 502 (as would be the case if the analog input signal varied from zero to 10 volts and the secondary ADC had a dynamic range of zero to 5 volts, for example).

In one embodiment, the resolution of the secondary ADC 502 equals that of the primary ADC 108 (i.e. N=K), but this need not be the case. For example, the primary ADC 108 may comprise an 8-Bit ADC, while the secondary ADC 502 may comprise a 12 or 16 bit ADC.

Returning to FIG. 6, block 604 determines if any of the reference K bit digital signal values differ from an associated N bit digital signal value (from the dynamic channel 506) by greater than a threshold amount, and block 606 signals at least one of the reference K-bit digital signal value that differ from the associated N bit digital signal value by greater than the threshold amount. These operations may be performed by the comparator 504. This signal can be provided for downstream processing and/or used to switch the provided output digital signal between the digital signal presented by the dynamic channel 506 and the static channel 508.

Hardware Environment

Figure 7:
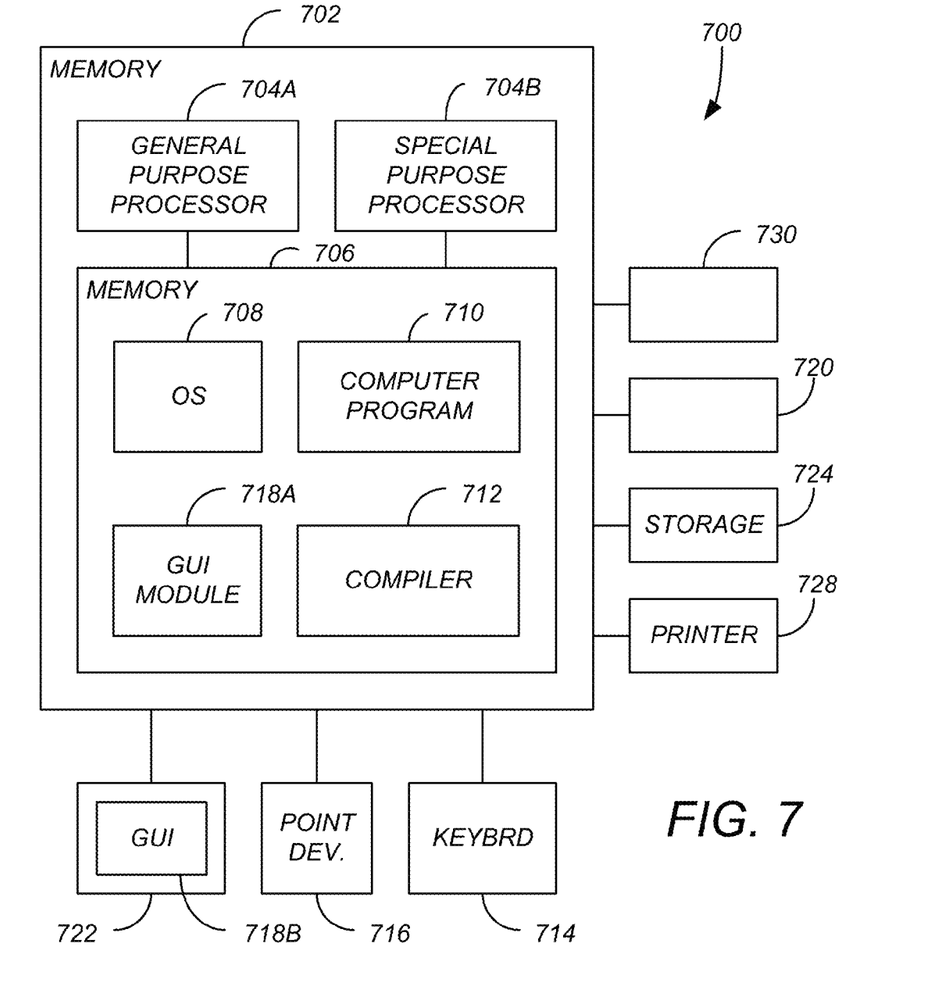
FIG. 7 illustrates an exemplary computer system that could be used to implement processing elements of the apparatus for converting the analog signal into the digital signal.

FIG. 7 illustrates an exemplary computer system 700 that could be used to implement processing elements of the above disclosure, including the processor 110, external devices 112, encoder 204 or decoder 206. The computer 702 comprises a processor 704 and a memory, such as random access memory (RAM) 706. The computer 702 is operatively coupled to a display 722, which presents images such as windows to the user on a graphical user interface 718B. The computer 702 may be coupled to other devices, such as a keyboard 714, a mouse device 716, a printer, etc. Of course, those skilled in the art will recognize that any combination of the above components, or any number of different components, peripherals, and other devices, may be used with the computer 702.

Generally, the computer 702 operates under control of an operating system 708 stored in the memory 706, and interfaces with the user to accept inputs and commands and to present results through a graphical user interface (GUI) module 718A. Although the GUI module 718B is depicted as a separate module, the instructions performing the GUI functions can be resident or distributed in the operating system 708, the computer program 710, or implemented with special purpose memory and processors. The computer 702 also implements a compiler 712 which allows an application program 710 written in a programming language such as COBOL, C++, FORTRAN, or other language to be translated into processor 704 readable code. After completion, the application 710 accesses and manipulates data stored in the memory 706 of the computer 702 using the relationships and logic that was generated using the compiler 712. The computer 702 also optionally comprises an external communication device such as a modem, satellite link, Ethernet card, or other device for communicating with other computers.

In one embodiment, instructions implementing the operating system 708, the computer program 710, and the compiler 712 are tangibly embodied in a computer-readable medium, e.g., data storage device 720, which could include one or more fixed or removable data storage devices, such as a zip drive, floppy disc drive 724, hard drive, CD-ROM drive, tape drive, etc. Further, the operating system 708 and the computer program 710 are comprised of instructions which, when read and executed by the computer 702, causes the computer 702 to perform the operations herein described. Computer program 710 and/or operating instructions may also be tangibly embodied in memory 706 and/or data communications devices 730, thereby making a computer program product or article of manufacture. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiments of the present disclosure. In summary, a method and apparatus for converting an analog signal into a digital signal is disclosed.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A method of converting an analog signal into a digital signal, comprising:
    (a) digitizing the analog signal into a plurality of N-bit digital signal values, wherein the plurality of N-bit digital signal values span from a minimum analog signal value $V_{min}$ to a maximum analog signal value $V_{max}$;
    (b) determining an updated minimum analog signal value $V_{min}$ and an updated maximum analog signal value $V_{max}$ from the plurality of N-bit digital signal values for a subsequent plurality of N-bit digital signal values;
    (c) repeating (a)-(b) for the subsequent plurality of N-bit digital signal values using the updated minimum analog signal value $V_{min}$ and the updated maximum analog signal value $V_{max}$;
    (d) repeating (a)-(c) for further subsequent pluralities of the N-bit digital signal values;
    (e) transmitting the plurality of N-bit digital signal values;
    (f) receiving the transmitted plurality of N-bit digital signal values;
    (g) scaling the received plurality of N-bit digital signal values according to the minimum analog signal value $V_{min}$ and to a maximum analog signal value $V_{max}$;
    (h) determining an updated minimum analog signal value $V_{min}$ and an updated maximum analog signal value $V_{max}$ from the received plurality of N-bit digital signal values; and
    (i) repeating (e)-(h) for one or more subsequent pluralities of N-bit digital signal values.

2. The method of claim 1, further comprising:
    digitizing the analog signal into a plurality of reference K-bit digital signal values, wherein the plurality of reference K-bit digital signal values span from a minimum possible analog signal value to a maximum possible analog signal value for all of the plurality of K-bit digital signal values and subsequent pluralities of N-bit digital signal values;
    determining if any of the reference K-bit digital signal values differ from an associated N-bit digital signal value by greater than a threshold amount; and
    signaling at least one of the reference K-bit digital signal values that differ from the associated K-bit digital signal value by greater than the threshold amount.

3. The method of claim 1, wherein:
    digitizing the analog signal into a plurality of N-bit digital signal values, wherein the plurality of N-bit digital signal values span from a minimum analog signal value $V_{min}$ to a maximum analog signal value $V_{max}$ comprises:
        digitizing the analog signal into M N-bit digital signal values, wherein the M N-bit digital signal values span from a minimum analog signal value $V_{min}$ to a maximum analog signal value $V_{max}$, and M is predetermined;
    determining an updated minimum analog signal value $V_{min}$ and an updated maximum analog signal value $V_{max}$ from the plurality of N-bit digital signal values comprises:
        determining an updated minimum analog signal value $V_{min}$ and an updated maximum analog signal value $V_{max}$ from the M N-bit digital signal values;
    determining an updated minimum analog signal value $V_{min}$ and an updated maximum analog signal value $V_{max}$ from the received plurality of N-bit digital signal values comprises:
        determining an updated minimum analog signal value $V_{min}$ and an updated maximum analog signal value $V_{max}$ from the received M N-bit digital signal values;
    repeating (a)-(d) for one or more subsequent pluralities of N-bit digital signal values comprises:
        repeating (a)-(d) for one or more subsequent groups of M N-bit digital signal values.

4. The method of claim 3, further comprising selecting $V_{min}$ and $V_{max}$ to be within an expected range of the analog signal associated with the M N-bit digital signals.

5. The method of claim 3, wherein determining an updated minimum analog signal value $V_{min}$ and an updated maximum analog signal value $V_{max}$ from the M N-bit digital signal values comprises:
    determining an updated minimum analog signal value $V_{min}$ and an updated maximum analog signal value $V_{max}$ from at least one of a minimum of the M N-bit digital signal values and a maximum of the M N-bit digital signal values.

6. The method of claim 5, wherein determining an updated minimum analog signal value $V_{min}$ and an updated maximum analog signal value $V_{max}$ from at least one of a minimum of the plurality of N-bit digital signal values and a maximum of the plurality of N-bit digital signal values comprises:
    determining an updated minimum analog signal value $V_{min}$ and an updated maximum analog signal value $V_{max}$ from the minimum of the plurality of N-bit digital signal values and the maximum of the plurality of N-bit digital signal values.

7. An apparatus for converting an analog signal into a digital signal, comprising:
    an analog to digital converter; and
    a processor, communicatively coupled to a memory comprising processor instructions, the processor instructions comprising instructions for:
        (a) commanding the analog to digital converter to digitize the analog signal into a plurality of N-bit digital signal values spanning from a minimum analog signal value $V_{min}$ to a maximum analog signal value $V_{max}$;
        (b) determining an updated minimum analog signal value $V_{min}$ and an updated maximum analog signal value $V_{max}$ from the plurality of N-bit digital signal values for a subsequent plurality of N-bit digital signal values;
        (c) repeating (a)-(b) for the subsequent plurality of N-bit digital signal values using the updated minimum analog signal value $V_{min}$ and the updated maximum analog signal value $V_{max}$;
        (d) repeating (a)-(c) for further subsequent pluralities of the N-bit digital signal values;

(e) scaling a received plurality of N-bit digital signal values according to the minimum analog signal value $V_{min}$ to a maximum analog signal value $V_{max}$;

(f) determining an updated minimum analog signal value $V_{min}$ and an updated maximum analog signal value $V_{max}$ from the received plurality of N-bit digital signal values; and (g) repeating (e)-(g) for one or more subsequent pluralities of N-bit digital signal values.

8. The apparatus of claim 7, wherein:

the apparatus further comprises a second analog to digital converter;

the processor instructions further comprises instructions for:

commanding the second analog to digital processor to digitize the analog signal into a plurality of reference N-bit digital signal values, wherein the plurality of reference N-bit digital signal values span from a minimum possible analog signal value to a maximum possible analog signal value for all of the plurality of N-bit digital signal values and subsequent pluralities of N-bit digital signal values;

determining if any of the reference N-bit digital signal values differ from an associated N-bit digital signal value by greater than a threshold amount; and signaling at least one of the reference N bit digital signal values that differ from the associated N-bit digital signal value by greater than the threshold amount.

9. The apparatus of claim 7, wherein:

the instructions for digitizing the analog signal into a plurality of N-bit digital signal values, wherein the plurality of N-bit digital signal values span from a minimum analog signal value $V_{min}$ to a maximum analog signal value $V_{max}$ comprise instructions for:

digitizing the analog signal into M N-bit digital signal values, wherein the M N-bit digital signal values span from a minimum analog signal value $V_{min}$ to a maximum analog signal value $V_{max}$, and M is predetermined;

the instructions for determining an updated minimum analog signal value $V_{min}$ and an updated maximum analog signal value $V_{max}$ from the plurality of N-bit digital signal values comprise instructions for:

determining an updated minimum analog signal value $V_{min}$ and an updated maximum analog signal value $V_{max}$ from the M N-bit digital signal values;

the instructions for determining an updated minimum analog signal value $V_{min}$ and an updated maximum analog signal value $V_{max}$ from the received plurality of N-bit digital signal values comprise:

instructions for determining an updated minimum analog signal value $V_{min}$ and an updated maximum analog signal value $V_{max}$ from the received M N-bit digital signal values;

repeating (a)-(d) for one or more subsequent pluralities of N-bit digital signal values comprises:

repeating (d)-(f) for one or more subsequent groups of M N-bit digital signal values.

10. The apparatus of claim 9, wherein the instructions further comprise instructions for selecting $V_{min}$ and $V_{max}$ to be within an expected range of the analog signal associated with the M N-bit digital signals.

11. The apparatus of claim 9, wherein the instructions for determining an updated minimum analog signal value $V_{min}$ and an updated maximum analog signal value $V_{max}$ from the M N-bit digital signal values comprise instructions for:

determining an updated minimum analog signal value $V_{min}$ and an updated maximum analog signal value $V_{max}$ from at least one of a minimum of the M N-bit digital signal values and a maximum of the M N-bit digital signal values.

12. The apparatus of claim 11, wherein the instructions for determining an updated minimum analog signal value $V_{min}$ and an updated maximum analog signal value $V_{max}$ from at least one of a minimum of the plurality of N-bit digital signal values and a maximum of the plurality of N-bit digital signal values comprise instructions for:

determining an updated minimum analog signal value $V_{min}$ and an updated maximum analog signal value $V_{max}$ from the minimum of the plurality of N-bit digital signal values and the maximum of the plurality of N-bit digital signal values.

13. A system for monitoring a physical property, the system comprising:

a sensor configured to output an analog signal representing the physical property;

an analog to digital converter; and a monitoring system, comprising a processor, communicatively coupled to a memory comprising processor instructions, the processor instructions comprising instructions for:

(a) commanding the analog to digital converter to digitize the analog signal into a plurality of N-bit digital signal values, wherein the plurality of N-bit digital signal values span from a minimum analog signal value $V_{min}$ to a maximum analog signal value $V_{max}$;

(b) determining an updated minimum analog signal value $V_{min}$ and an updated maximum analog signal value $V_{max}$ from the plurality of N-bit digital signal values for a subsequent plurality of N-bit digital signal values;

(c) repeating (a)-(b) for the subsequent plurality of N-bit digital signal values using the updated minimum analog signal value $V_{min}$ and the updated maximum analog signal value $V_{max}$;

(d) repeating (a)-(c) for further subsequent pluralities of the N-bit digital signal values;

(e) scaling a received plurality of N-bit digital signal values according to the minimum analog signal value $V_{min}$ and to a maximum analog signal value $V_{max}$;

(f) determining an updated minimum analog signal value $V_{min}$ and an updated maximum analog signal value $V_{max}$ from the received plurality of N-bit digital signal values; and (g) repeating (e)-(g) for one or more subsequent pluralities of N-bit digital signal values.

14. The system of claim 13, wherein:

the system further comprises a second analog to digital converter;

the processor instructions further comprise instruction for:

commanding the second analog to digital processor to digitize the analog signal into a plurality of reference N-bit digital signal values, wherein the plurality of reference N-bit digital signal values span from a minimum possible analog signal value to a maximum possible analog signal value for all of the plurality of N-bit digital signal values and subsequent pluralities of N-bit digital signal values;

determining if any of the reference N-bit digital signal values differ from an associated N-bit digital signal value by greater than a threshold amount; and signaling at least one of the reference N bit digital signal values that differ from the associated N-bit digital signal value by greater than the threshold amount.

15. The system of claim 14, wherein the instructions for determining an updated minimum analog signal value $V_{min}$ and an updated maximum analog signal value $V_{max}$ from the M N-bit digital signal values comprise instructions for:
  determining an updated minimum analog signal value $V_{min}$ and an updated maximum analog signal value $V_{max}$ from at least one of a minimum of the M N-bit digital signal values and a maximum of the M N-bit digital signal values.

16. The system of claim 13, wherein:
  the instructions for digitizing the analog signal into a plurality of N-bit digital signal values, wherein the plurality of N-bit digital signal values span from a minimum analog signal value $V_{min}$ to a maximum analog signal value $V_{max}$ comprise instructions for:
    digitizing the analog signal into M N-bit digital signal values, wherein the M N-bit digital signal values span from a minimum analog signal value $V_{min}$ to a maximum analog signal value $V_{max}$, and M is predetermined;
  the instructions for determining an updated minimum analog signal value $V_{min}$ and an updated maximum analog signal value $V_{max}$ from the plurality of N-bit digital signal values comprise instructions for:
    determining an updated minimum analog signal value $V_{min}$ and an updated maximum analog signal value $V_{max}$ from the M N-bit digital signal values;
  the instructions for determining an updated minimum analog signal value $V_{min}$ and an updated maximum analog signal value $V_{max}$ from the received plurality of N-bit digital signal values comprise:
    instructions for determining an updated minimum analog signal value $V_{min}$ and an updated maximum analog signal value $V_{max}$ from the received M N-bit digital signal values;
  repeating (a)-(d) for one or more subsequent pluralities of N-bit digital signal values comprises:
    repeating (a)-(d) for one or more subsequent groups of M N-bit digital signal values.

17. The system of claim 16, wherein the instructions further comprise instructions for selecting $V_{min}$ and $V_{max}$ to be within an expected range of the analog signal associated with the M N-bit digital signals.

* * * * *